(12) United States Patent
Otremba

(10) Patent No.: US 7,705,470 B2
(45) Date of Patent: Apr. 27, 2010

(54) SEMICONDUCTOR SWITCHING MODULE AND METHOD

(75) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 147 days.

(21) Appl. No.: 11/835,238

(22) Filed: Aug. 7, 2007

(65) Prior Publication Data

US 2008/0029906 A1   Feb. 7, 2008

(30) Foreign Application Priority Data

Aug. 7, 2006   (DE) ................ 10 2006 037 118

(51) Int. Cl.
*H01L 23/48* (2006.01)

(52) U.S. Cl. ................ 257/778; 257/777

(58) Field of Classification Search ........... 257/734, 257/777, 778; 438/627, 643, 653, 927
See application file for complete search history.

(56) References Cited

U.S. PATENT DOCUMENTS

| | | | | |
|---|---|---|---|---|
| 5,550,436 A | * | 8/1996 | Houk | 315/209 R |
| 6,060,795 A | * | 5/2000 | Azotea et al. | 307/150 |
| 6,078,097 A | * | 6/2000 | Ohsawa | 257/666 |
| 6,717,828 B2 | * | 4/2004 | Iwagami et al. | 363/56.03 |
| 6,946,740 B2 | * | 9/2005 | Schaffer | 257/777 |
| 7,045,884 B2 | * | 5/2006 | Standing | 257/678 |
| 7,459,750 B2 | * | 12/2008 | Ludikhuize et al. | 257/334 |
| 2006/0273810 A1 | * | 12/2006 | Ganitzer et al. | 324/755 |

FOREIGN PATENT DOCUMENTS

| | | |
|---|---|---|
| DE | 10 2004 021 054 | 11/2005 |
| DE | 10 2005 007 373 | 8/2006 |
| WO | 2006/087065 | 8/2006 |

* cited by examiner

*Primary Examiner*—Wai-Sing Louie
*Assistant Examiner*—Sue Tang
(74) *Attorney, Agent, or Firm*—Dicke, Billig & Czaja, PLLC

(57) ABSTRACT

The invention relates to a semiconductor switching module for on-board electrical supply systems comprising a plurality of semiconductor chips, and a method for producing the same. The semiconductor switching module has at least one half-bridge circuit comprising a first semiconductor circuit chip as LSS (low side switch) and a second semiconductor circuit chip as HSS (high side switch) on a common circuit structure. The circuit structure includes contact pads on the top side of the circuit structure and lead connections with external contact areas on the underside of the circuit structure and with internal contact areas on the top side of the circuit structure. In this case, at least one of the semiconductor circuit chips is arranged on contact pads of the circuit structure using flip-chip technology and is electrically and cohesively connected to the contact pads by using diffusion solder layers.

19 Claims, 3 Drawing Sheets

SEMICONDUCTOR SWITCHING MODULE AND METHOD

CROSS-REFERENCE TO RELATED APPLICATIONS

This Utility Patent Application claims priority to German Application No. DE 10 2006 037 118.6, filed Aug. 7, 2006, which is herein incorporated by reference.

BACKGROUND

The invention relates to a semiconductor switching module for on-board electrical supply systems, including a plurality of semiconductor chips. The invention furthermore relates to a method for producing a semiconductor switching module of this type. The semiconductor switching module is intended to realize at least one half-bridge circuit including a first semiconductor circuit chip as LSS (low side switch) and a second semiconductor circuit chip as HSS (high side switch) on a common circuit structure. For this purpose, the circuit structure has lead connections with external contact areas on the underside of the circuit structure and internal contact areas on the top side of the circuit structure and also with contact pads on the top side of the circuit structure.

A semiconductor switching module forms a multi-chip module for "motor bridges." MCM modules of this type are based on a DCB technique (direct copper bonding), in which a plurality of semiconductor circuit chips are paste-soldered alongside one another and contact-connected by using bonding wires. A paste solder bonding process of this type can only be used if the semiconductor circuit chips are arranged in "drain-down mounting" on a circuit structure. In the case of this "drain-down mounting", with the aid of the paste solder, a large-area external contact of the semiconductor circuit chip, which covers the entire rear side of the semiconductor circuit chip, is electrically connected to a correspondingly large contact pad of the circuit structure.

If the semiconductor circuit chip has a plurality of small-area electrodes, too, which are intended to be arranged on a corresponding contact pad of the circuit structure by using surface mounting, as is necessary in the case of a flip-chip technology, then the paste solder bonding process fails since short-circuits can occur between the small-area and large-area electrodes of the semiconductor circuit chip that are surface-mounted alongside one another.

Consequently, the reliability of multi-chip modules produced by the paste-solder bonding process is manifested only if the semiconductor circuit chips are mounted by their large-area drain electrodes on individual contact pads that are insulated from one another. Consequently, nodes of a half-bridge circuit have to be produced by using correspondingly thick bonding tape and/or bonding wire connections.

For these and other reasons there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

The invention will now be explained in more detail with reference to the accompanying figures.

DETAILED DESCRIPTION

Figure 1:
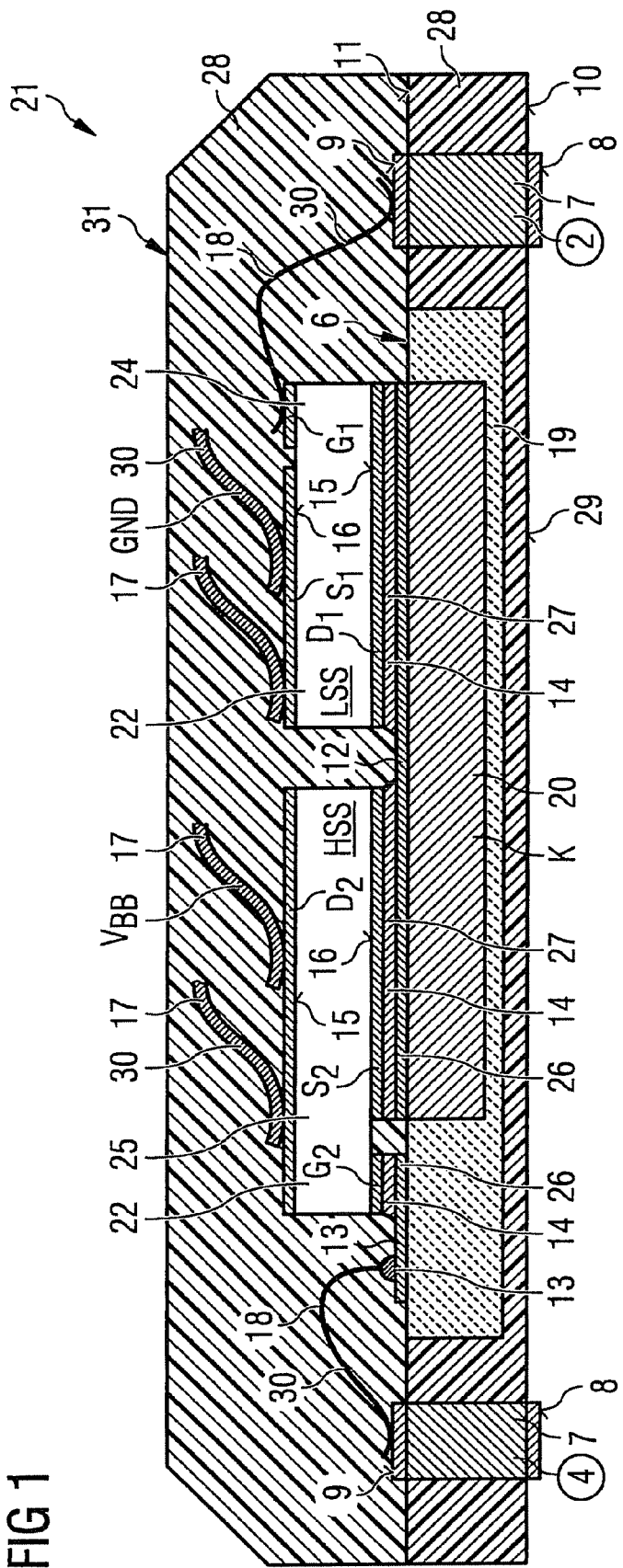
FIG. 1 illustrates a schematic cross section through a semiconductor switching module of one embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment optimizes a semiconductor switching module for a "motor bridges" application and ensures the reliability of a motor bridge circuit of this type. The circuit structure is simplified and the number of bonding connections carrying high current are minimized.

One embodiment provides a semiconductor switching module for on-board electrical supply systems including a plurality of semiconductor chips, and a method for producing the same. The semiconductor switching module has at least one half-bridge circuit including a first semiconductor circuit chip as LSS (low side switch) and a second semiconductor circuit chip as HSS (high side switch) on a common circuit structure. The circuit structure includes contact pads on the top side of the circuit structure and lead connections with external contact areas on the underside of the circuit structure and with internal contact areas on the top side of the circuit structure. In this case, at least one of the semiconductor circuit chips is arranged on contact pads of the circuit structure using flip-chip technology and is electrically and cohesively connected to the contact pads by using diffusion solder layers.

A semiconductor switching module of this type allows for large-area rear side contacts of the semiconductor circuit chips to be electrically connected and fixed on separate connection contact areas of a circuit carrier, and it is also possible to connect nodes of a half-bridge or bridge circuit by using a common large-area contact pad of a circuit carrier by virtue of the fact that it is possible to interconnect a large-area drain electrode of a first semiconductor power chip using drain-down technology on a common contact pad with a large-area source electrode of a semiconductor circuit chip using flip-chip technology.

In this case, the large-area contact pad can be realized by a correspondingly thick metal plate, such that high switching currents can pass through the node without corresponding bonding connections having to be established. The diffusion solder layers simultaneously ensure that a small-area gate electrode of the second semiconductor circuit chip arranged using flip-chip technology can be connected on a small-area contact pad of the circuit carrier, which contact pad is insulated and electrically isolated from the large-area contact pad, by using the one diffusion solder layer, without the risk of short-circuits between the small-area electrode and the large-area electrode of the second semiconductor circuit chip arranged using flip-chip technology occurring as a result of the connecting technique. Consequently, a reliable semiconductor switching module is realized in the form of a half-bridge circuit for motor driving arrangements in on-board electrical supply systems.

In one embodiment, the first and the second semiconductor circuit chip are power semiconductor components of the MOSFET type. The power semiconductor components have, on their rear sides, large-area surface-mountable drain electrodes and, on their top sides, surface-mountable electrodes including a large-area source electrode and a small-area gate electrode. In this embodiment, large-area is understood to mean an electrode which covers virtually the entire top side or rear side of a semiconductor circuit chip. By contrast, small-area is understood to mean an electrode which takes up only a small region of the top side or rear side of a power semiconductor chip, such as, for example, a control or gate electrode of a power semiconductor component.

For realizing a half-bridge circuit, the circuit structure of the semiconductor switching module has at least two contact pads, wherein a large-area contact pad receives a drain electrode of the first semiconductor circuit chip and a source electrode of the second semiconductor circuit chip and electrically connects them to form a node, and wherein a small-area contact pad is electrically connected to a gate electrode of the second semiconductor circuit chip and is distinctly insulated from the first large-area contact pad of the circuit structure. In one embodiment, the individual electrodes of the semiconductor circuit chips are diffusion-soldered on the contact pads of the circuit structure and it is thereby ensured that no inadvertent short-circuits that jeopardize the reliability of the semiconductor module arise during flip-chip mounting.

In this embodiment, the first semiconductor circuit chip is surface-mounted by its large-area drain electrode on its rear side, by using a diffusion solder layer, with a large-area contact pad of the circuit structure using DCB (direct copper bonding). At the same time, the contact pad is connected to the large-area source electrode of the top side of the second semiconductor circuit chip mounted using flip-chip technology in such a way that the large-area contact pad forms the node of the half-bridge circuit.

The diffusion solder layers are composed of a diffusion solder material having at least one of the materials AuSn, AgSn, CuSn and/or InAg. One advantage of such diffusion solder layers, besides precise separation of the electrode regions to be connected during flip-chip mounting, is, in addition, that the intermetallic phases of the diffusion solder materials that arise have a higher melting point than the diffusion solder temperatures required for forming the diffusion solder layer.

In a further embodiment of the invention, the semiconductor module has at least five lead connections. Lead connections of this type have an external contact area on the underside of the circuit structure, which is externally accessible, and an internal contact area on the top side of the circuit structure, which internal contact area can be connected to electrodes of the circuit chips by using bonding connections.

A first lead connection is connected to ground potential by its external contact area and is connected by its internal contact area, by using a bonding tape connection or by using aluminum bonding wires, to the source electrode of the first semiconductor circuit chip. Since, by using the bonding tape connection or by using the aluminum bonding wires, high current density is to be transported from the source electrode of the first semiconductor circuit chip to the ground potential of the lead connection, a high cross section is provided both for the bonding tape connection and for the aluminum bonding wires, which cross section ensures that there is no risk of such a connection melting.

A second lead connection enables, via its external contact area an access to a gate electrode of the first semiconductor circuit chip. For this purpose, the internal contact area of the second lead connection is connected to the gate electrode of the first semiconductor circuit chip by using a bonding wire. Since only signal currents flow via such a bonding wire, the bonding wire can be realized from a gold wire having a thickness of a few micrometers. Such thin bonding wire connections require relatively small-area contact pads on the circuit structure and correspondingly small-area contact areas on the semiconductor circuit chips to be used.

A third lead connection enables, by its external contact area an access to a node of the semiconductor switching module. For this purpose, the internal contact area of the third lead connection is connected to a common contact pad of the circuit structure by using a bonding tape connection or by using aluminum bonding wires. Since the common contact pad of the circuit structure simultaneously represents the node of the half-bridge circuit, access to the node of the semiconductor switching module is thus assured via the third lead connection and via its external contact area.

A fourth lead connection enables, via its external contact area an access to a gate electrode of the second semiconductor circuit chip. For this purpose, the internal contact area of the fourth lead connection is connected to a small-area contact pad of the circuit structure by using a bonding wire. The gate electrode of the second semiconductor circuit chip is fixed on the small-area contact pad by using a diffusion solder layer using flip-chip technology. With this fourth lead connection, not only is access to a gate electrode made possible, but advantages of a flip-chip construction for the second semiconductor circuit chip also become clear.

A fifth lead connection is connected to a supply potential by its external contact area. The lead connection is connected by its internal contact area, by using bonding tapes or by using aluminum bonding wires, to the drain electrode of the second semiconductor circuit chip. A high current intensity through the half-bridge circuit is then made possible by using the fifth lead connection if, for example, a load is connected to the node and the HSS semiconductor circuit chip is turned on.

In one embodiment, the circuit structure is partly constructed on a circuit carrier composed of ceramic and has a large-area contact pad of a copper plate which is embedded into the ceramic material and which is coated with a diffusion solder material. The semiconductor circuit chips to be connected to a diffusion solder layer only have to be pressed onto this large-area metal plate at diffusion solder temperature.

On the other hand, it is also possible for the metal plate composed of copper to remain uncoated and for only the large-area electrodes of the semiconductor circuit chips to have a coating composed of diffusion solder material. With this solution, the diffusion solder layer areas can be minimized. The circuit carrier composed of ceramic material furthermore has one advantage that, on the one hand, it has a higher thermal conductivity than a surrounding molding compound composed of plastic and, on the other hand, this lead carrier composed of ceramic, for the diffusion solder process, can be heated to the elevated temperatures of up to 450° C. for the diffusion soldering without being damaged.

Furthermore, it is possible for the circuit structure to have a multilayered contact pad having a copper layer as base layer and an upper layer composed of diffusion solder material. In this case, which in particular for the small-area contact pads, only the ceramic material of the circuit carrier is provided with a copper layer, the embedding of a metal plate being omitted.

The circuit structure can be enclosed by an encapsulant which embeds the lead connections, external contact areas of the lead connections on the underside of the semiconductor switching module and internal contact areas at a level of the abovementioned circuit carrier remaining free of encapsulant, in order to fit the connecting elements such as aluminum bonding wires, bonding tape connections and/or gold bonding wires in a further process.

In an extended embodiment, a free wheeling diode is additionally provided on the circuit structure. Free wheeling diodes of this type protect the semiconductor circuit chips against overloads and are arranged between the source and drain of the semiconductor chips.

In one embodiment, the semiconductor circuit chips have vertical charge-compensated MOSFETs as power switches. These vertical charge-compensated MOSFETs have a minimized forward resistance and can switch high currents at a low forward resistance. They can additionally be equipped with an integrated gate driver circuit, whereby the reliability of the semiconductor switching module is increased. Finally, it is possible to provide as gate electrode a vertical trench gate electrode in the semiconductor circuit chips, whereby a technological improvement of the semiconductor switching module once again becomes possible. A semiconductor switching module of this type is used as a battery protection circuit or as a motor bridge circuit or as part of a DC/DC and/or AC/DC converter.

A method for producing a semiconductor switching module has the following method. A first process involves producing a circuit structure composed of copper plates, which are embedded into a circuit carrier composed of ceramic, for at least one large-area contact pad and a small-area contact pad on the top side of the circuit carrier. Furthermore, lead connections are produced with external contact areas at the level of the underside of the circuit carrier and internal contact areas at the level of the top side of the circuit carrier.

A circuit structure is thus provided on which the further components of the semiconductor switching module can then be applied with their connecting elements. For this purpose, firstly semiconductor circuit chips of the MOSFET type are produced. Afterward, the electrodes of the semiconductor circuit chips and/or the contact pads, the external contact areas and the internal contact areas are coated with a diffusion solder material. The circuit structure is then equipped with at least one semiconductor circuit chip using flip-chip technology with diffusion soldering of source electrode and gate electrode onto corresponding contact pads of the circuit structure by virtue of a contact pressure being exerted on the semiconductor circuit chips at a diffusion solder temperature. After the semiconductor circuit chips have been fixed on the contact pads of the circuit carrier, connecting elements are fitted between electrodes of the semiconductor circuit chips or between contact pads of the circuit structure and the internal contact areas of the lead connections.

Finally, the now functional semiconductor switching module can be incorporated into a module housing. The module housing may include an encapsulant which completely encloses the individual components apart from the external contact areas of the lead connections. However, a module housing of this type may also have a metal enclosure which, in one embodiment, simultaneously serves as a cooling area.

In one exemplary implementation, before the diffusion soldering of the electrodes of the semiconductor power chips on the contact pads of the circuit carrier, diffusion solder layers composed of the diffusion solder material are applied to the electrodes of the semiconductor circuit chips, which layers have at least one of the materials AuSn, AgSn, CuSn and/or InAg and form, during diffusion soldering, intermetallic phases whose melting points are higher than a diffusion soldering temperature. In this case, the diffusion soldering temperature $T_D$ at which the semiconductor circuit chips are applied by their electrodes to the contact pads of the circuit structure is between $180° C. \leq T_D \leq 450° C.$ For preparing the lead connections, a leadframe can be produced from a metal plate, a planar copper plate with a plurality of semiconductor switching module positions. For the purpose of structuring the planar metal plate, the latter can be stamped and/or subjected to wet or dry etching in order to work the lead connections there from. On the other hand, it is also possible to produce a leadframe with a leadframe structure by using metal material electrodeposited on an auxiliary carrier and to remove the auxiliary carrier again after the semiconductor switching modules have been completed.

Bonding wire connections are introduced for the purpose of fitting connecting elements between a small-area gate electrode of the top side of a semiconductor circuit chip and provided internal contact areas of lead connections of the leadframe in the semiconductor switching module positions. On the other hand, bonding tapes or aluminum bonding wires are used as connecting elements if high currents are to be transported, as for connections between large-area electrodes of the semiconductor circuit chips and the provided internal contact areas of corresponding lead connections.

Since, in the case of this technique on a leadframe, a plurality of semiconductor switching modules arise in the semiconductor switching module positions of the leadframe, the leadframe is subsequently separated into individual semiconductor switching modules by using a laser separating technique or a stamping technique or a sawing technique. However, such separation can also be effected by using an etching method.

Figure 3:
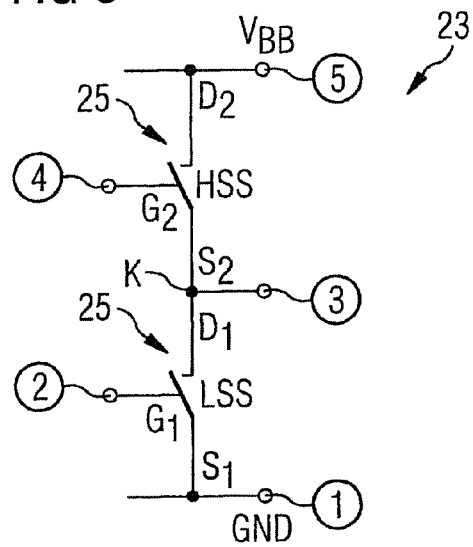
FIG. 3 illustrates a schematic circuit diagram of a half-bridge circuit for an on-board electrical supply system.

FIG. 1 illustrates a schematic cross section through a semiconductor switching module 21 of one embodiment. The semiconductor switching module 21 has semiconductor chips 22, wherein a first semiconductor circuit chip 24 is arranged as LSS (low side switch) and a second semiconductor circuit chip 25 is arranged as HSS (high side switch) of a half-bridge circuit 23, which is illustrated in FIG. 3. A node K of the half-bridge circuit is formed by a copper plate 20 embedded in a circuit carrier 19 composed of ceramic material, wherein, on a large-area contact pad 12 of the copper plate 20, the drain electrode $D_1$ on the rear side 15 of the first semiconductor circuit chip 24 is fixed by using a diffusion solder layer 14 and the source electrode $S_2$ on the top side 16 of the second semiconductor circuit chip 25 arranged using flip-chip technology is fixed by using a further diffusion layer 14.

Via the common copper plate 20, high currents can flow between the drain electrode $D_1$ of the first semiconductor circuit chip 24 and the source electrode $S_2$ of the second semiconductor circuit chip 25 without the semiconductor switching module 21 heating up to an impermissible extent. There is furthermore applied on the circuit carrier 19 composed of ceramic a small-area contact pad 13 as copper layer 26, which is connected to a small-area gate electrode $G_2$ of the second semiconductor circuit chip 25 by using a diffusion layer 14. Alongside the copper plate 20 as node K of the half-bridge circuit, in the case of this semiconductor switching module 21, at least five lead connections 7 are provided, the lead connections 2 and 4 of which are illustrated in this cross section. The lead connections 2 and 4 have external contact areas 8 at the underside 10 of a common circuit structure 6, which simultaneously forms the underside 29 of the semiconductor switching module 21, via which external contact areas the gate electrodes $G_1$ and $G_2$ of the first and the second semiconductor circuit chip 24 and 25, respectively, can be accessed.

For this purpose, a bonding wire 18 is fixed on the internal contact area 9 of the second lead connection 2, which bonding wire ends on the gate electrode $G_1$ of the top side 16 of the first semiconductor circuit chip 24. Since only signal currents flow via the bonding wire 18, a bonding wire having a thickness of a few micrometers can be used here. The same applies to the lead connection 4, via the external contact area 8 of which access to the gate electrode $G_2$ of the second semiconductor circuit chip 25 arranged using flip-chip technology is made possible. Here, too, the internal contact area 9 of the lead connection 4 is connected to a contact pad 13 on the circuit carrier 19 by using a bonding wire 18 having a thickness of a few micrometers, wherein the small-area contact pad 13 is simultaneously connected to the gate electrode $G_2$ of the second semiconductor circuit chip 24 by using a diffusion solder layer 14.

The source electrode $S_1$ of the first semiconductor circuit chip 24 is electrically connected, by using aluminum bonding wires 17, to the ground potential GND via a further lead connection 7 (not illustrated). The drain electrode $D_2$ of the second semiconductor circuit chip 25 is also electrically connected, by using aluminum bonding wires 17, to a lead connection 7 (not shown) that is at a supply potential $V_{BB}$. The top side 11 of the common circuit structure 6 and also the two semiconductor circuit chips 24 and 25 and the connecting elements 30 are embedded into an encapsulant 28, which simultaneously forms the module housing 31.

Figure 2:
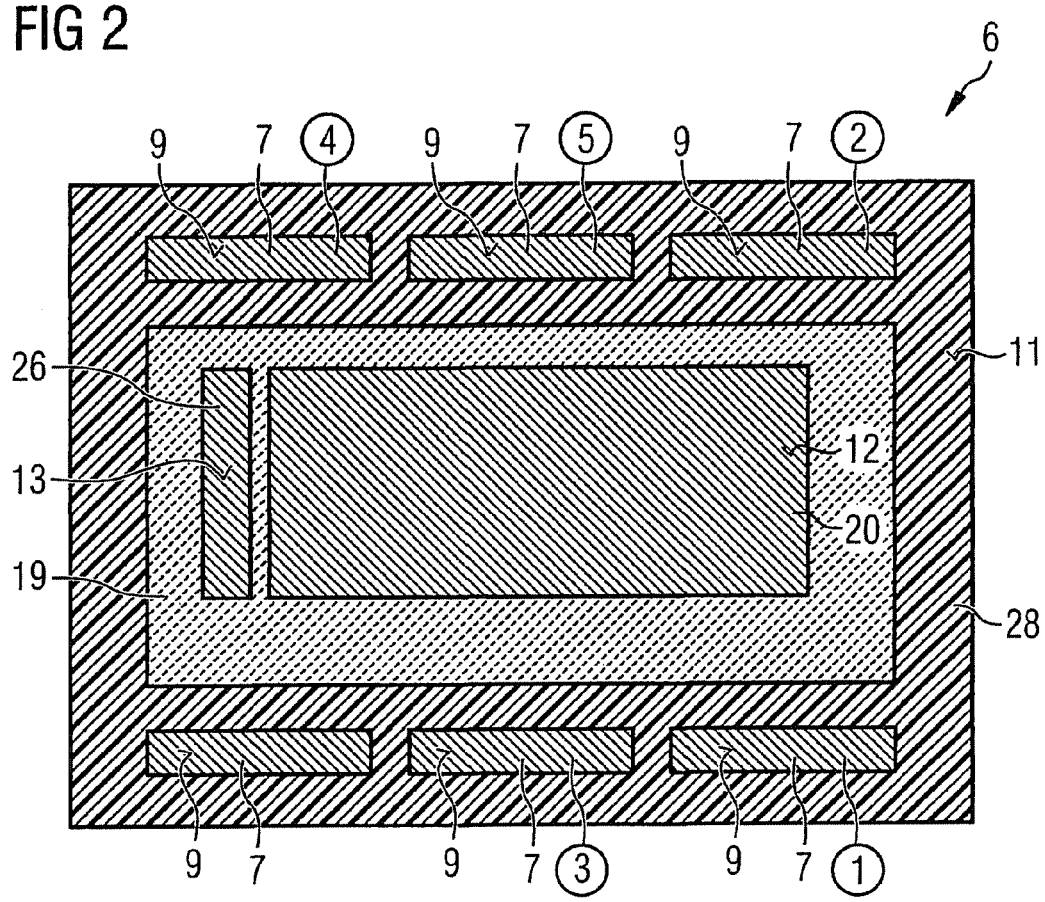
FIG. 2 illustrates a schematic plan view of a circuit structure for a semiconductor switching module in accordance with FIG. 1.

FIG. 2 illustrates a schematic plan view of a circuit structure 6 for a semiconductor switching module 21 in accordance with FIG. 1. Arranged in the center of the circuit structure 6 is a metal plate 20, which, with its top side, forms a large-area contact pad 12 of the circuit structure 6. This copper plate 20 is embedded flush in a circuit carrier 19 composed of ceramic material. Arranged alongside the large-area contact pad 12 is a small-area contact pad 13, which includes a copper coating on the circuit carrier 19 composed of ceramic material.

The small-area contact pad 13 serves for receiving a gate electrode of a second semiconductor circuit chip and for connection to a lead connection 4 of the lead connections 7 that are arranged in two edge regions of the circuit structure 6. Only the internal connection areas 9 of the lead connections 7 can be seen in this plan view. The circuit carrier 19 composed of ceramic and also the metallic lead connections 7 are embedded into an encapsulant 28 that keeps the contact pads 12 and 13 and the internal contact areas 9 and also the external contact areas of the lead connections 7 free of encapsulant.

FIG. 3 illustrates a schematic circuit diagram of a half-bridge circuit 23 for an on-board electrical supply system. The semiconductor circuit chips LSS and HSS are arranged in series between the supply potential $V_{BB}$ and the ground potential GND and thus between the lead connections 1 and 5. A node K is arranged between the two semiconductor circuit chips 24 and 25, at which node the drain electrode $D_1$ of the LSS and the source electrode $S_2$ of the HSS are combined and can be contact-connected via the lead connection 3. The respective gate electrodes $G_1$ and $G_2$ can be driven via the lead connections 2 and 4. A half-bridge of this type is realized on a circuit structure 6 with FIG. 4.

Figure 4:
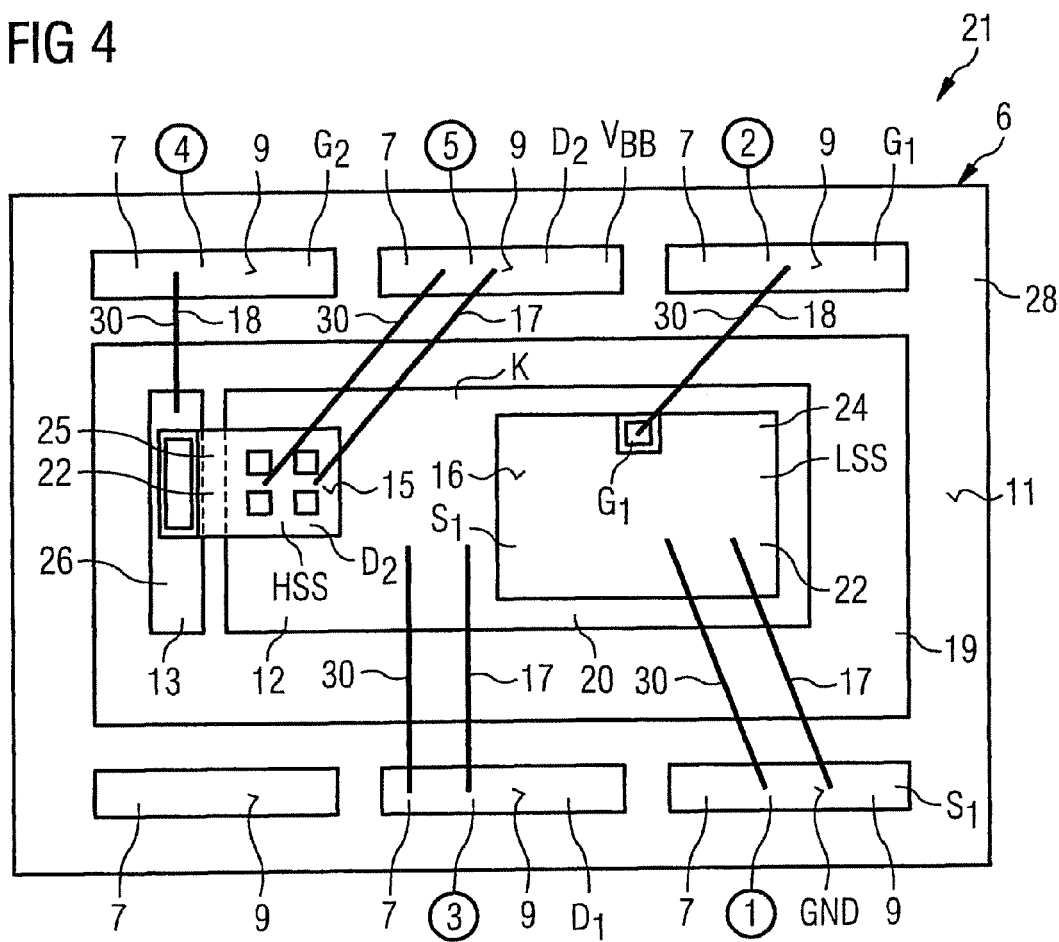
FIG. 4 illustrates a schematic plan view of an equipped circuit carrier.

FIG. 4 illustrates a schematic plan view of an equipped circuit carrier 19. The covering of the semiconductor switching module 21 and the encapsulant as illustrated in FIG. 1 have been omitted in order to illustrate the equipping of the circuit carrier 19. A large-area contact pad 12 and a small-area contact pad 13 are situated on the circuit carrier 19 composed of ceramic, the circuit carrier being surrounded by an encapsulant 28. While the large-area contact pad 12 belongs to a copper plate 20 embedded into the circuit carrier 19 composed of ceramic material, the small-area contact pad 13 is formed by a copper layer 26. The semiconductor chips 22 are arranged on the metal plate 20, wherein the first semiconductor circuit chip 24 is fixed by its drain electrode on the metal plate 20 and the second semiconductor circuit chip 25 is arranged by its source electrode on the common large-area contact pad 13 of a copper plate 20.

Consequently, the copper plate 20 forms the node K, which is illustrated for a half-bridge in FIG. 3. The node K is accessible via aluminum wires 17 and the third lead connection 3 in the encapsulant. A ground potential GND can be applied to the source electrode $S_1$ of the first semiconductor circuit chip 24 via the lead connection 1. Finally, the drain electrode $D_2$ of the second semiconductor circuit chip can be accessed via a fifth lead connection 5. In this case, a sixth lead connection 7 is not connected up, especially as the half-bridge as illustrated in FIG. 3 manages with five lead connections 1 to 5.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor module comprising:
    a ceramic circuit structure:
    at least one half-bridge circuit comprising a first semiconductor circuit chip as a low side switch and a second semiconductor circuit chip as a high side switch the common circuit structure;
    contact pads on a top side of the circuit structure:
    lead connections with external contact areas on an underside of the circuit structure; internal contact areas on the top side of the circuit structure; the second semiconductor circuit chip arranged on contact pads of the circuit structure using flip-chip technology, wherein the circuit structure has a large-area contact pad which receives and is directly connected to a drain electrode of the first semiconductor circuit chip and to a source electrode of the second semiconductor circuit chip, and a small-area contact pad which is electrically connected to a gate electrode of the second semiconductor circuit chip.

2. The module of claim 1, comprising wherein the first and the second semiconductor circuit chip are power semiconductor components of a MOSFET type which have, on their rear sides, large-area surface-mountable drain electrodes and, on their top sides, surface-mountable electrodes comprising a large-area source electrode and a small-area gate electrode.

3. The module of claim 1, wherein the first semiconductor circuit chip is surface-mounted by its large-area drain electrode on its rear side, by a diffusion solder layer, on a large-area contact pad of the circuit structure using direct copper bonding, wherein the contact pad is simultaneously connected to the large-area source electrode of the top side of the second semiconductor circuit chip mounted using flip-chip technology in such a way that the large-area contact pad forms a node of the half-bridge circuit.

4. The module of claim 1, comprising wherein diffusion solder layers have at least one of the materials AuSn, AgSn, CuSn and/or InAg as diffusion solder material.

5. The module of claim 1, comprising wherein the semiconductor module has at least five lead connections.

6. The module of claim 1, comprising wherein a first lead connection is connected to ground potential by its external contact area and is connected by its internal contact area, by using a bonding tape connection or by using aluminum bonding wires, to the source electrode of the first semiconductor circuit chip.

7. The module of claim 1, comprising wherein a second lead connection enables, via its external contact area an access to a gate electrode of the first semiconductor circuit chip, wherein the internal contact area of the second lead connection is connected to the gate electrode of the first semiconductor circuit chip by using a bonding wire.

8. The module of claim 1, comprising wherein a third lead connection enables, by its external contact area an access to a node of the semiconductor switching module, wherein the internal contact area of the third lead connection is connected to a common contact pad of the circuit structure by using a bonding tape connection or by using aluminum bonding wires.

9. The module of claim 1, comprising wherein a fourth lead connection enables, via its external contact area an access to a gate electrode of the second semiconductor circuit chip, wherein the internal contact area of the fourth lead connection is connected to a small-area contact pad of the circuit structure by using a bonding wire, and wherein the gate electrode of the second semiconductor circuit chip is fixed on the small-area contact pad by using a diffusion solder layer using flip-chip technology.

10. The module of claim 1, comprising wherein a fifth lead connection is connected to a supply potential by its external contact area and is connected by its internal contact area, by using bonding tapes or by using aluminum bonding wires, to the drain electrode of the second semiconductor circuit chip.

11. The module of claim 1, comprising wherein the circuit structure is constructed on a circuit carrier composed of ceramic and has a large-area contact pad of a copper plate which is embedded into the ceramic material and which is coated with a diffusion solder material.

12. The module of claim 1, comprising wherein the circuit structure has a multilayered contact pad having a copper layer as base layer and an upper layer composed of diffusion solder material.

13. The module of claim 1, comprising wherein the circuit carrier is enclosed by an encapsulant and embeds the leads wherein external contact areas of the lead connections on the underside of the semiconductor switching module and internal contact areas at a level of a circuit carrier remain free of encapsulant.

14. The module of claim 1, comprising wherein a free wheeling diode is additionally arranged on the circuit structure.

15. The module of claim 1, comprising wherein at least one of the semiconductor circuit chips mounted on contact pads using flip-chip technology of the circuit structure is electrically and cohesively connected to the contact pads by using diffusion solder layers.

16. The module of claim 1, comprising wherein the semiconductor circuit chips have vertical charge-compensated MOSFETs, wherein at least one semiconductor circuit chip has an integrated gate driver circuit in addition to the MOSFET.

17. The module of claim 1, wherein the gate electrode is a vertical trench gate electrode.

18. The use of the module of claim 1 as a battery protection circuit.

19. A semiconductor module comprising:
 a circuit structure;
 at least one half-bridge circuit comprising a first semiconductor circuit chip as a low side switch and a second semiconductor circuit chip as a high side switch on the common circuit structure:
 contact pads on a top side of the circuit structure;
 lead connections with external contact areas on an underside of the circuit structure;
 internal contact areas on the top side of the circuit structure;
 the second semiconductor circuit chip arranged on contact pads of the circuit structure using flip-chip technology, the circuit structure including a large-area contact pad directly connected to a drain electrode of the first semiconductor chip and to a source electrode of the second semiconductor chip; and
 an on-board electrical supply system.

* * * * *